United States Patent [19]

Tasso

[11] 4,028,665
[45] June 7, 1977

[54] INFORMATION STORE SYSTEM COMPRISING A PLURALITY OF DIFFERENT SHIFT-REGISTERS

[76] Inventor: Joseph Nageeb Tasso, 18 rue de la Glaciere, 75013 Paris, France

[22] Filed: June 3, 1975

[21] Appl. No.: 583,402

[30] Foreign Application Priority Data
June 7, 1974  France .............................. 74.19818

[52] U.S. Cl. ............................................. 340/172.5
[51] Int. Cl.² ........................................... G06F 13/02
[58] Field of Search ................. 340/172.5; 235/165

[56] References Cited
UNITED STATES PATENTS
3,778,778  12/1973  Ragen .............................. 340/172.5
3,781,819  12/1973  Geng et al. ..................... 340/172.5

Primary Examiner—Gareth D. Shaw
Assistant Examiner—C. T. Bartz
Attorney, Agent, or Firm—Cushman, Darby & Cushman

[57] ABSTRACT

The invention provides for a store comprising a plurality of store sections. Each section comprises a plurality of block shift-registers. Each block shift-register in a section can have characteristics different from the other ones. One of those block shift-registers is a high speed shift-register and accordingly, the blocks contained therein can be accessed with a high speed.

11 Claims, 11 Drawing Figures

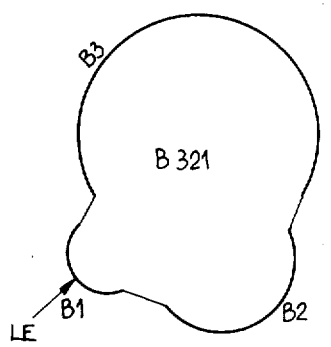
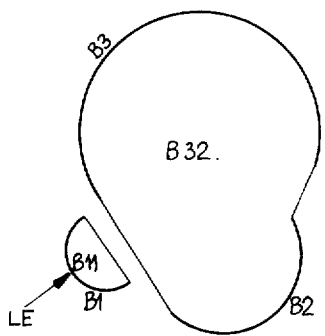
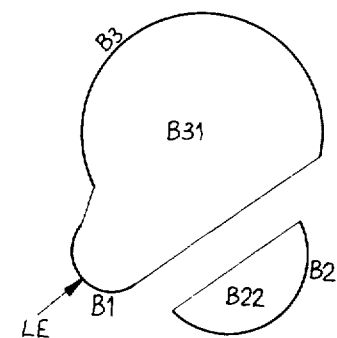
Fig. 1A　　　　Fig. 1B　　　　Fig. 1C
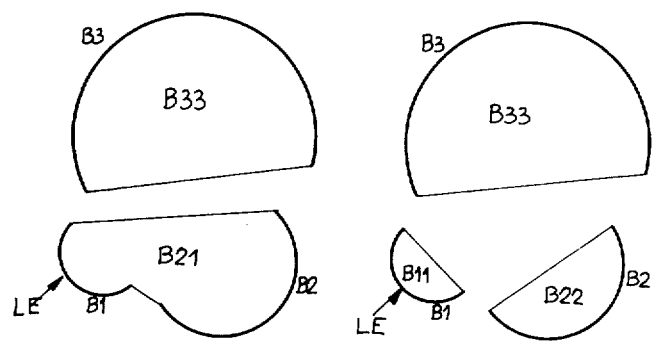
Fig. 1D　　　　Fig. 1E
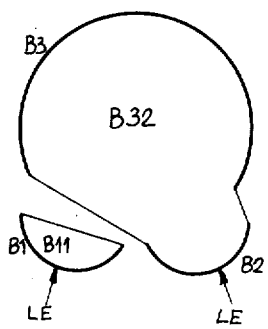
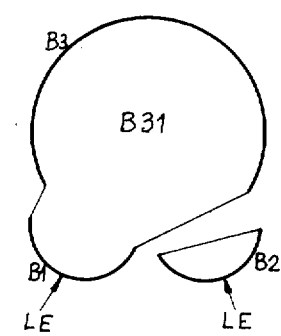
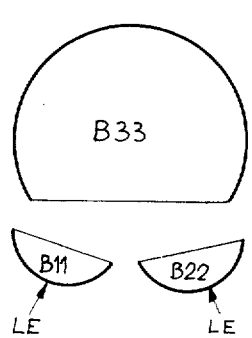
Fig. 2A　　　　Fig. 2B　　　　Fig. 2C

INFORMATION STORE SYSTEM COMPRISING A PLURALITY OF DIFFERENT SHIFT-REGISTERS

BACKGROUND OF THE INVENTION

1. Field of the Invention

The invention relates to a new organization of memory for a data processing system.

2. Description of the Prior Art

In the present specification, the term "shift-register" will generally be used for indicating a block-shifting register; also, the term "read-write means" associated with a "shift-register" will indicate a block read-write means. In the prior art, the access time for a shift-register is equal to L/2, L being the length of the shift-register. In U.S. Pat. No. 3,735,361, a memory organization for obtaining an average access time in the range of only one or few steps of a shift-register is disclosed. This organization may replace the random main memory and possibly the "cache". Accordingly, the relative independence of the average access time with respect to the length of the shift-register enables utilization of sets of shift-registers having a great length as main memories and accordingly to substantially reduce the bit cost and the bulk of main memories. According to U.S. Pat. No. 3,735,361 which will be incorporated herein by reference, each large shift-register comprises at least one read-write means and constitutes a memory section. Accordingly, if N sections are used, N blocks are accessible without shifting. Accordingly, in each section, the cited patent provides for the arrangement of blocks into "pages" of at least one block and it appears from experiments that in a given page comprising adjacent blocks of the main memory, there is a large probability that successive requests from the computer processor relate to the same page or the same block (refer to J. Tasso, Mémoires sequentielles d'apparence aleatoire utilisables comme memoires centrales — Communication 64 pages 330–341, International symposium on Memories — Paris Oct. 23–26, 1973, published by Societe des Electriciens, Electroniciens et Radioelectriciens).

There is also a large probability that the read-write means of each memory section looks successively for data in the same page, in particular in a shift-register forming a section (a section shift-register). Accordingly, for embodying the memory organization disclosed in the referred to patent, it is necessary to have the possibility to stop actually or ficticiously a given block in front of the read-write device of the associate section, that is the shift-register has to be static or pseudo-static. The pseudo-static shift-registers comprise the dynamic registers in which to-and-fro refreshment local oscillations are provided.

Ideal shift-registers for implementing the memory organization described in the cited patent would be high-speed, static or pseudo-static two-way shift-registers having a low bit cost. In fact, it appears that the shift-registers having the lowest bit cost have not, or have only partially, the three other features. For example, the charge coupled device (CCD) registers are not static and necessitate a refreshment; the magnetic bubble shift-registers are static but relatively slow; the magnetic disks or drums which are in permanent rotation can simulate shift-registers but are not static. It should be noted that, when using magnetic disks, drums or tapes, a serial/parallel conversion would be preferably made in order to form block registers and to form the various sections of the registers; otherwise a too great disk number would be necessary. On the other hand, static and two-way shift-registers such as for example static or pseudo-static flip-flop registers have a bit cost which is presently relatively expensive.

SUMMARY OF THE INVENTION

A first object of the invention is to provide means for utilizing conventional shift-registers in order to form a memory section in a memory organization such as the one disclosed in the above cited patent.

Another object of the invention is to provide switching and synchronizing means necessary for associating various types of shift-registers in order to form a memory section according to the above cited patent.

For achieving those objects and others, the invention provides for the realization of shift-registers, each of which constitutes a section, from a plurality of elementary shift-registers of different technology which can be serially connected, one at least of those elementary registers being provided with read-write means and being capable of being looped, switching and synchronizing means being provided for coupling again this elementary register with the other elementary registers, the overall loop or section being again arranged in its original order.

BRIEF DESCRIPTION OF THE DRAWINGS

Those objects, features and advantages of the invention will be explained in greater detail in the following description of preferred embodiments made in connection with the attached drawings wherein:

FIGS. 1A to 1E schematically show various configurations formed from three elementary shift-registers (or fragments), a single block read-write means being provided in connection with one of those elementary shift-registers;

FIGS. 2A to 2C schematically show various configurations formed from three fragments of shift-registers, a block read-write means being provided in front of two of those shift registers;

DESCRIPTION OF THE PREFERRED EMBODIMENTS

Figure 4:
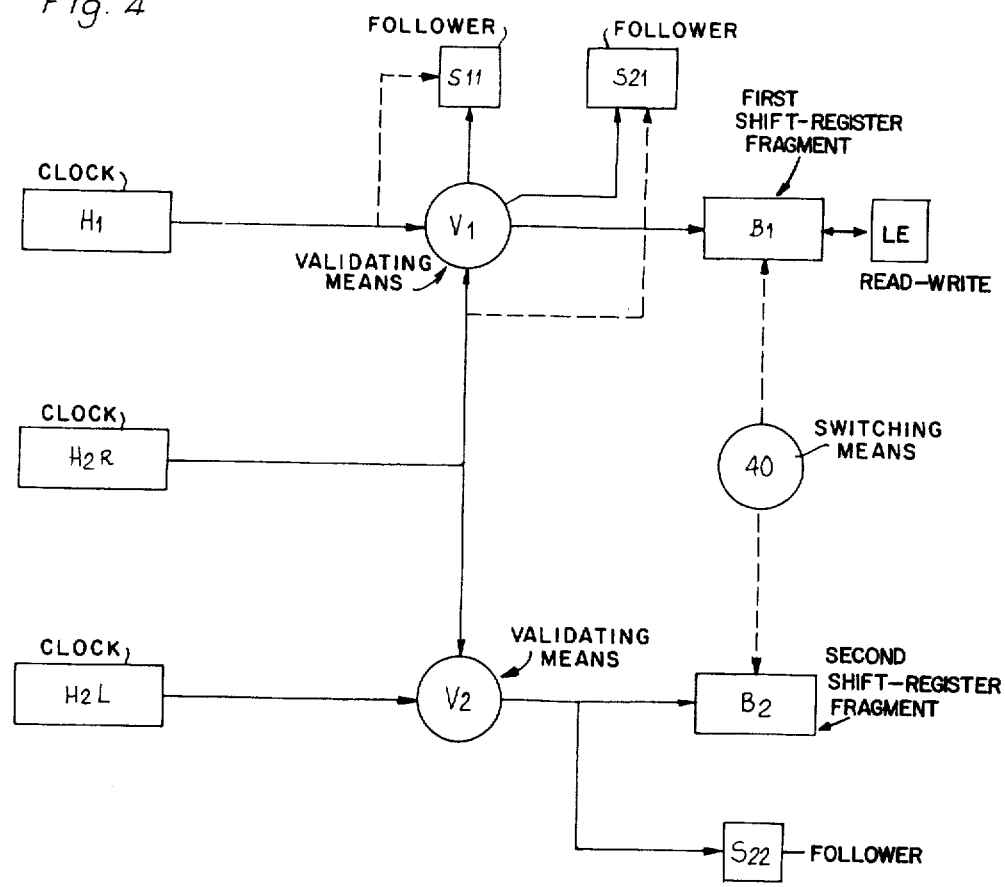
FIG. 4 schematically shows some of the elements necessary for switching and synchronizing the fragments in case two fragments of shift-registers are used.

A main aspect of the invention is to provide for the utilization of a plurality of shift-registers having different characteristics and/or technologies in order to form a memory section and to reduce accordingly the bit cost of the memory section. Thus, the invention provides for the realization of a memory section by means of at least one shift-register fragment having a great length and a low bit cost and of at least one shorter shift-register for storing some data blocks to which it is possible to have a high-speed access. FIGS. 1, 2 and 3 show various possible associations of shift-register fragments which will be disclosed later on.

FIG. 1A shows a looped shift-register B321, this shift-register B321 comprising three serially connected shift-registers or fragments B3, B2 and B1. Those three fragments are made of shift-registers of various technologies or of various characteristics. Such registers may for example be magnetic disks, drums or tapes arranged in the form of shift-registers or any other type of known shift-registers. The full length of the loop B321 is L = L1 + L2 + L3, L1, L2 and L3 being the length of each fragment. For example, the fragment B3 may be a non-accessible shift-register, that is a shift-register comprising no read-write means accessible from the processors, this register being dynamic (or mechanical) and having a low speed; the fragment B2 may be a non-accessible register being of dynamic technology and having a higher speed; and the fragment B1 may be a high speed static or pseudo-static accessible shift-register. In case of such a loop B321, the seeking of a block is made as disclosed in above cited patent. Accordingly, with the loop B321, it is possible to have anyone of the blocks stored in the various registers in front of the read-write means, but it will be apparent that with such a loop, the slower fragment (B3) will determine the speed of the seeking of a block.

In case the memory requests relate to a block from the fragment B1 among the blocks contained in the loop B321, the loop B321 will be transformed into two loops, a loop B11 which is constituted by the shift-register B1 looped over itself and a loop B32 constituted by the serial connection of the shift-registers B3 and B2; in this configuration shown in FIG. 1B, the fragments B3 and B2 can communicate at the speed of the fragment B3. With such an arrangement, it is possible to have a high-speed access to the blocks contained in the loop B11 and to refresh simultaneously the loop B32.

Three other configurations are shown in FIGS. 1C, 1D and 1E. Referring to FIG. 1C, a loop B31 is constituted by the serial connection of the fragments B3 and B1 and a loop B22 is constituted by the closing of the shift-register B2. FIG. 1D shows a configuration comprising two loops B21 (register B2 and register B1 serially connected) and B33 (a closed loop formed by the register B3). In FIG. 1E, each shift-register B1, B2 and B3 is arranged in a closed loop and loops B11, B22 and B33 are formed. With this latter configuration, the loop B11 permits a high-speed access to the blocks contained in the register B1 while the data contained in the two dynamic loops B33 and B22 are refreshed. This configuration enables the data contained in each of the loops B33 and B22 to be refreshed according to their own rythm with a minimum loss of power.

Accordingly, the invention permits to have access to any data block contained in the shift-register B1 with a very high speed. Moreover, as the probability that a block belonging to a given page be neither in the register B1 nor in the register B2 is very low, the register B3 could be chosen of a one-way type without substantially increasing the access time to the memory constituted by the set of the three registers B1, B2 and B3, if the register B2 is long enough.

In the following specification, the above notations will by systematically used, that is a loop formed by closing an elementary shift-register Bi will be called loop Bii and a loop made of the serial connection of three elementary shift-registers Bi, Bj and Bk will be called loop Bijk.

Referring to FIG. 2, another embodiment of the invention consists in using a set of three fragments: a shift-register B3 of a low bit cost, for example of the dynamic type and comprising no accessible read-write means and two identical shift-registers B2 and B1 comprising read-write means and being static and of high-speed, respectively. Moreover, in this example, L3 will be chosen much larger than L2 = L1. In this example, five coupling configurations of those three registers are again possible. The three more interesting coupling are shown in FIGS. 2A, 2B and 2C. In FIG. 2A, a two loop configuration B32 and B11 is formed. In this configuration B11 permits a high-speed access to the blocks contained in the register B1 while a seeking operation is made in the loop B32 at the speed determined by the slower element, B3. FIG. 2B shows a configuration with two loops B31, B22, symmetrical of the former one. FIG. 2C shows a configuration with three loops B33, B22, B11 enabling a high-speed access to the blocks contained in the loops B11 and B22 while the loop B33 is refreshed. An important advantage of this second embodiment is that more than one set of blocks are simultaneously accessible. This example can be extended for permitting a simultaneous access to a plurality of block sets among the blocks contained in a large capacity section.

Figure 3A:
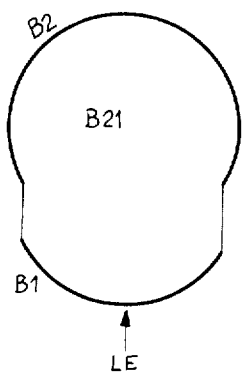
FIGS. 3A and 3B schematically show two configurations formed from two fragments of shift-registers, a single block read-write means being provided in front of one of those shift-registers.
Figure 3B:
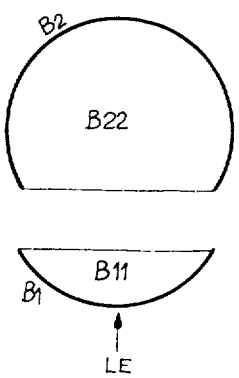

FIG. 3 shows a simple preferred embodiment of the invention comprising two shift-registers. The shift-register B1 has a small length and can be for example a 32-blocks, static two-way, high-speed shift-register. The register B2 has a great length, and is for example a CCD dynamic shift-register having a length of 4,064 blocks. Such CCD shift-registers can be largely integrated and their shifting speed can be very high. With two such shift-registers B1 and B2, two configurations are possible. The first one shown in FIG. 3A consists in a loop B21 in which all the blocks are accessible by the read-write means associated with the register B1, the shifting (or the seeking process) being made at the speed of the shift-register B2; in such a configuration, the loops B11 and B22 will be considered as not existing. In the second configuration shown in FIG. 3B, the two registers are arranged in closed loops B22 and B11, the register B11 comprising a selected set of adjacent blocks, while the register B22 can be refreshed; with such a configuration, the loop B21 will be considered as not existing.

The inventor emphasizes that the examples described in connection with FIGS. 1, 2 and 3 are only embodiments of the present invention, that is any other combination of a plurality of fragments having different lengths and of different technologies or characteristics is possible. Moreover, pseudo-static registers have been mainly described; it will also be noted that the various registers used can be one-way or two-way registers according to the fact that the shift-time of a given number of data in the registers is greater or lower than a value giving the whole desired access time.

The main aspects of the invention have been explained hereover. However, for embodying the invention, it is necessary to provide switching and synchronizing means in order to form the various possible loop configurations with a given number of shift-register fragments. The switching means will not be disclosed in further details as various gate means for closing a register or for serially connecting a plurality of given registers are well known in the art. As regards the synchronizing means, it will be appreciated that it is necessary to locate the position of the data in the various loops at the moment of separating the loops and to put again the data in the order that they had at the instant of the separation when those loops are combined again. In this purpose, according to the invention, means for synchronizing the position of the blocks, which will be called "followers", are associated with each useful loop of a set of fragments constituting a section. In the latter description, a preferred embodiment will be disclosed in connection with a section comprising two fragments as described in connection with FIG. 3.

When the loop B21 is formed, a follower, such as an up and down counting means indicates the address X21 of the block which is in front of the read-write device. If the requested block has the address F, the algebrical difference F-X21 is the relative address of the requested block having an absolute address F. While separating the loop B21 into two loops B22 and B11, the value X21 provided by the follower S21 associated with this loop will be stored; then each of the loops B22 and B11 will be tracked by the respective followers S22 and S11. Those followers will in particular permit, when the loop B21 is formed from the loops B22 and B11, to control the clocks associated with said loops for rearranging the content of those loops in the state which was existing at the moment of the separation.

In connection with FIG. 3, FIG. 4 shows very schematically two shift-register fragments B1 and B2; three clock means H1, H2R, H2L; three follower means S11, S21 and S22; two validating means, V1 and V2; and a switching means 40 which is provided either for closing the fragments B1 and B2 in order to form the loops B11 and B22, or for forming a single loop B21 comprising the serial connection of the fragments B2 and B1.

The function of the validating means V1 is to direct either the signals from the clock H1 or the signals from the clock H2R towards the clock input of the shift register B1. Also, when the signals of the clock H1 are directed towards the first shift register fragment B1, to enable the follower (or counter S11) in order that the signals from the clock H1 (indicated by the dashed lines between H1 and S11) increment the follower S11. Further, when the signals from the clock H2R are directed towards the first shift register fragment B1, the validating means V1 enables the follower (or counter S21), in order that the signals from the clock H2R (dashed lines between the clock H2R and the follower S21) increment the follower S21.

The function of the validating means V2 is to direct the signals from the clock H2R or from the clock H2L towards the shift register fragment B2 and the followr S22.

No detailed description of the validating means V1 and V2 is included herewith inasmuch as it is within the skill of those in this art to implement a validating means as soon as the logic conditions to which the validating means has to respond are known. For the present invention, these conditions or "enable conditions" are indicated throughout the course of the detailed description of the invention and can also be summed up in the following table:

| Enable Condition | Loop | H1 clock | H2R clock | H2L clock |
| --- | --- | --- | --- | --- |
| 1. WAIT | B22-B11 | — | — | B2;S22 |
| 2. FB1 is true | B22-B11 | B1;S11 | — | B2;S22 |
| 3. Rendez-vous | B22-B11 | B1;S11 | B2;S22 | — |
| 4. Research | B21 | — | B2;B1;S21 | — |

In the configuration where the two loops B22 and B11 are formed, the loop B22 is in a refreshment state, that is this loop is controlled by the slow clock H2L by means of a suitable control of the validating means V2, the shifting of the content of the loop B22 being followed by the follower S22 and the loop B11 being in a wait state or in a read state. This loop B11 is controlled by its own clock H1 and tracked by the follower S11, a suitable control being made by means of the validating means V1.

When the loop B21 is formed by a suitable control of the switching means 40, the contents of the segments B1 and B2 are shifted by a clock H2R which corresponds to the highest speed to which the register B2 can be shifted. In this state this loop is tracked by the follower S21.

S11 and S22 are differential followers counting the shifts made in B11 and B22 from the instant of the dislocation of the loop B21, located by the value X21. On the other hand, the switching means 40 will be assumed to operate more quickly than the quickest clock, that is the clock H1. The loop B21 is formed when a block is seeked and is not in the loop B11. At this time, the content of the followers S11 and S22 is 0 and shifts are carried out on the loop B21 for shifting the requested block in front of the read-write means of the fragment B1. At the time this block is in front of the read-write means of the fragment B1, the switching means 40 opens the loop B21 and the two loops B22 and B11 are formed. Alternatively the two loops B22 and B11 could be formed as soon as the requested block enters the fragment B1. The loop B22 is permanently tracked by its follower S22 for indicating at each instant the location of the blocks contained in this fragment, this location changing with respect to the refreshment. Then, if other memory requests are made, relating the the considered section or more specifically to a block contained in the loop B11, the clock H1 is operated for shifting the requested block in front of the read-write means in the loop B11. The follower S11 counts the shifts of the content of the loop B11. Accordingly if a memory call is made relating to a block contained in the loop B22 and no longer in the loop B11, the loop B21 has to be formed again, that is the loops B22 and B11 have to be shifted back to the state in which they were at the instant of the dislocation of the loop B21. Accordingly, the follower S11 and the follower S22 have to display 0 and the connection has to be made at this instant between the two loops by means of the switching means 40. The followers S11 and S22 must be simultaneously at their 0 mark at the time of the connection. In case B1 is static, the synchronization of B11 is made prior to the synchronization of B22. Accordingly, the instant passage from the "synchronization" step to the "seeking" step allows the fragment B2 never to be stopped. Accordingly, the data contained in the blocks which were comprised in the loop B21 when the fragments B1 and B2 are connected according to a closed loop are not lost.

It will be apparent to those skilled in the art that the various followers are modulo $l$, $l$ being the length of the loops to which they are associated.

However, as regards the follower S22, this one is modulo R if a to-and-fro refreshment having an amplitude R is used. Moreover, the oscillation will have a central value R/2 which will be then considered as the 0 of this follower.

For example, if B2 is a two-way dynamic CCD register and B1 a static register, R will be the distance beween two refreshing cells of B2. The length of B1, L1, can also be chosen equal to R.

A synchronizing and switching mode of the different loops have been disclosed hereover in connection with a specific embodiment in which one of the loops (B22) necessitates to be refreshed. Those skilled in the art will understand that this example can be generalized to the case in which the two loops or none of them necessitate to be refreshed and can also be generalized to the cases where more than two loops are used.

The invention has been described only in connection with one section of the memory, this section being constituted of shift-registers having different characteristics. In case more than one section is used, each one being analogous to the one described in connection with FIG. 4, it will be noted that, if the follower S22 has to remain always associated with each dynamic fragment B2 of each section, the follower S21 is always "sharable", that is this follower can be time-shared between a plurality of sections, as two followers S21 belonging to two different sections will never operate at the same time. Accordingly, the number of used followers can be reduced. Moreover, in case the loop B11 is constituted of a static fragment, the follower S11 is also sharable, that is only one follower S11 can be used for all the loops B11 of the various sections. In this case, however, a storage of the display of the followers S21 and S11 has to be provided in a storage table. It will be apparent that such a sharing and storing process will be carried out only in case it causes a cost saving or other advantages. Moreover, in the described embodiment, one waiting section is automatically in the form of two loops (B11–B22). Those skilled in the art will also note that in case the fragment B2 is a static fragment such as a magnetic bubble register, no refreshment is necessary and accordingly, no follower S22 has to be provided the loop B22 having not to be formed).

The display x21 of the follower S21 is used in any configuration (B21 or B11–B22) for determining if a block belongs to the fragment B1 or not, and all the requested addresses have to be compared with x21.

The invention will now be explained in more details, in particular as regards the logical design thereof. This logical design will be explained in connection with a preferred embodiment wherein a memory module comprises N sections, each section comprising L blocks. The capacity of the memory module is accordingly N.L blocks. The whole memory of the computer will preferably comprise a plurality of such memory modules in order to permit a change of module and of process in case a large number of shifting steps is to be provided. Each section is comprised of two parts (segments) B1 and B2 having respective lengths L1 and L2 (L = L1 + L2). Those segments can be either in the mode B21 or in the mode B22–B11 as explained hereover and as shown in FIGS. 3A and 3B respectively. Accordingly, two main cases may arise:

The section is in a wait state, that is no request is made towards a block of this section. It will be understood that all the sections may be simultaneously in a wait state.

The section is concerned by a request.

Those two cases will be described in more details later on.

I. The section is in a wait state

In this case, the section is in the mode B22–B11 (FIG. 3B).

I.1. The loop B21 is not formed (or does not exist); accordingly the follower S21 corresponding to this loop is stopped. The last value X21 displayed by this follower S21 can be stored and accordingly only one follower S21 can be used for the N sections and each section will use this follower when necessary, if this results in a less expensive arrangement.

Generally speaking, such a share of a follower is possible each time a loop does not exist or when a loop is static.

I.2. The loop B22 is refreshed. This refreshment is tracked by the differential follower S22. In this case, S22 is not sharable as the N loops B22 of the N sections cannot be stopped, as they are of the dynamic type. Accordingly, N followers S22 are provided. In this case, the refreshment shifting in B22 is controlled by the refreshment clock H2L which can be a low speed clock. It is preferred to make the refreshment in a to-and-fro way having a whole amplitude R, R being the step number between two refreshment stations. It will be noted that in case of a to-and-fro refreshment of the loop B22 having an amplitude ± R/2 around the central value, the most significant bit of the binary number X22 representing the shift indicates the direction of the shifting necessary to come back to the central value considered as the origin.

If B2 is a static fragment, in the magnetic bubble technology for example, no refreshment is necessary. The formation of B2 in a closed loop is unnecessary and the follower S22 has not to be provided for. With some dynamic technologies (M.O.S. for example), the refreshment may be made inside the same bit. The block shift-register B2 will then appear as static.

If B2 is of a mechanical type (magnetic tape, drum or disk), there is no refreshment but the constant rotation of the drum is analogous to such a refreshment. In this case, the mechanical device has to deliver a clock pulse corresponding to each data block. This is easier than to control the mechanical device by an external clock.

I.3. The loop B11 and its differential follower S11 are stopped. B1 being static, S11 is sharable and only one follower S11 is necessary for the N sections. x11, which is the last value of S11 in the considered section, is stored like x21 (refer to I.1. hereover).

II. The section is concerned by a request

We shall call hereunder F the rank of a block and FB1 the logical signal determining that the block having the rank F belongs to B1. It can be shown that FB1 is true if:

$$\left[ |F - x21| < \frac{L1}{2} \right]$$

or $$\left[ |F - x21| > L - \frac{L1}{2} \right]$$

If L can be written in the form $2^A$ and $L_1$ in the form $2^B$, this condition reads:

FB1 is true if the A−B+1 more significant bits of |F − x21| are either all 0 or all 1. It is reminded that if FB1 is true, this means that the requested block belongs to B1 and if FB1 is wrong, this means that the requested block belongs to B2.

II.1. FB1 is true. The request concerns the fragment B1 of the section.

The configuration B22–B11 (FIG. 3B) is maintained. In this case, B21 does not exist and B22 is not concerned by the request, accordingly those loops are in the state disclosed above in I.1. and I.2. respectively. The search of the block having the rank F is done in the loop B11 at the highest speed possible in said loop B11.

Lets C be: C = F − X21 − X11 of course, in a circular geometry the distances are defined modulo the length of the circumference and the variation interval of the variables has to be defined. In the above formula, the following intervals are chosen $$\left(-\frac{L}{2}, +\frac{L}{2}\right)$$

for F-X21 and $$\left(-\frac{L1}{2}, +\frac{L1}{2}\right)$$

for X11.

If $|C| < \frac{L1}{2}$, the optimum shifting direction is given by the sign of C.

If $|C| \geq \frac{L1}{2}$, the optimum shifting direction is given by the opposite sign of C.

If $|C| < \frac{L1}{2}$, the number of shifting steps will be $|C|$.

If $|C| \geq \frac{L1}{2}$, the number of shifting steps will be L1 − $|C|$.

When C = 0, the requested block is in the front of the read-write means and the shifting is stopped. It will be noted that this case II.1. is very frequent as explained in the preamble of the present specification.

II.2. FB1 is wrong. The request concerns a block in the fragment B2 of the considered section. Accordingly, the operation has to be implemented into two steps:

A first step of synchronization or "rendez-vous" prior to the connection of the loop B21.

A second step of researching the block having the rank F in the loop B21.

II.2.1. Rendez-vous step.

This step is carried out in the mode B22–B11 (FIG. 3B). B21 does not exist as explained in the paragraph I.1. The two loops B11 and B22 are shifted until X11 = 0 and X22 = 0. When X11 and X22 are equal to 0, the loop B21 is formed instantaneously, that is between two clock pulses.

It will be understood that "shift until X22 = 0" means "come back to the central value" in case of a to-and-fro refreshment as explained hereabove and "shift until X11 = 0" is equivalent to "seek the block having the address F = X21". Indeed, as per II.1., at the end of the seeking step, C = 0 and then X11 = 0.

II.2.2. Research step.

It will be appreciated that this is the only case where the loop B21 is formed. In this case, B22 and B11 do not exist and X22 and X11 = 0 as explained hereover. Accordingly, the follower S21 is adapted to track the loop B21 at the highest speed permitted in the segment B2. The shifting conditions are the same one than in the case II.1. by changing in the formula L1 into L = L1 + L2 which is the length of the loop B21. In this case, X11 = 0 and the signal C remains the same one in every configuration.

The present embodiments are to be considered in all respects as illustrative and not restrictive, the scope and principle of the invention being indicated by the claims rather than by the foregoing description, and all changes which come within the meaning and range of equivalents of the claims are therefore intended to be embraced therein.

What is claimed is:

1. For a program controlled information processing system operating on multi-data blocks, a large capacity store comprising:
   a plurality of addressable memory sections, each having simultaneously controllable bit shift-registers equal in number to the number of bits in a data block to constitute a data-block shift-register of addressable block line positions and being individually controllable for a step by step operation;
   each said data block shift-register in a memory section being comprised of elementary block shift-registers or fragments having different characteristics, those fragments being selectively serially connectable or adapted to be looped;
   read-write means associated with at least one of said fragments;
   closing means associated with said at least one fragment in order to form a closed loop;
   switching and synchronizing means provided in order to form an overall closed loop with said at least one fragment and the other ones.

2. A large capacity store according to claim 1 wherein the shift-register forming a section is constituted of a first shift-register or fragment having a low capacity and a very high shifting speed, this first shift-register comprising read-write means, and of a second shift-register or fragment having a large capacity and being of the dynamic type.

3. A large capacity store according to claim 2 wherein the second shift-register is of the CCD type including regeneration cells and comprising means for a to-and-fro refreshment, the amplitude of the to-and-fro refreshment oscillations being sufficient for all the regeneration cells to refresh all the data.

4. A store according to claim 1, wherein means are provided for enabling said fragments to be looped alone, according to a small set, or all together, and wherein switching and synchronizing means are provided for combining said fragments according to the original order of the data contained in said fragments.

5. A store according to claim 1, wherein a follower means is associated with each useful loop capable of being formed by selectively connecting said fragments constituting the memory sections, each said follower means tracking the position of data blocks in the loop with which it is associated.

6. A store according to claim 1, wherein a first clock means is associated with each fragment of shift-register, said first clock means permitting operation of each shift-register fragment at its maximum shifting speed, and wherein a second clock means is associated with each fragment or combination of fragments comprising dynamic shift-registers, said second clock means functioning to shift said dynamic shift-registers at their optimum refreshment speed.

7. A store according to claim 2, further comprising:
a first clock means associated with said first high speed shift-register,
a second and a third clock means associated with said second dynamic shift-register,
said second clock means functioning to shift the second shift-register at its maximum shifting speed, and
said third clock means functioning to refresh said second shift-register at its optimum refreshment speed.

8. A store according to claim 7 comprising:
a first follower means associated with a first loop formed by closing the first shift-register on itself,
a second follower means associated with a second loop constituted by closing the second shift register on itself, and
a third follower means associated with a third loop constituted by the serial connection of the first and the second shift-registers, said first, second and third follower means tracking the position of data blocks in the loops with which they are respectively associated.

9. A store according to claim 8 comprising:
means for carrying out a seeking of a block on said third loop for shifting a requested block in front of the read-write means of the first fragment,
means for forming the first and second loops, the follower means of said first and second loops being at a zero value,
means for storing the contents of the follower of the third loop,
switching means for forming the third loop from the first and second loops once the contents of the follower means of the first and second loops are at the zero value, that is the value that those follower means indicated at the time of the formation of the first and second loops from the third loop.

10. A store according to claim 1, wherein one or more of the shift-register fragments comprise a parallel access to one or more blocks for reading and/or writing.

11. A store according to claim 5, further comprising means for memorizing the content of the follower means associated with the non-formed loops or the static loops of a section, whereby those followers can be used in connection with the respective corresponding loops of another section.

* * * * *